United States Patent [19]
Kawasumi et al.

[11] Patent Number: 5,732,099
[45] Date of Patent: Mar. 24, 1998

[54] SEMICONDUCTOR LIGHT EMITTING DEVICE

[75] Inventors: Takayuki Kawasumi; Norikazu Nakayama; Akira Ishibashi; Yoshifumi Mori, all of Kanagawa, Japan

[73] Assignee: Sony Corporation, Tokyo, Japan

[21] Appl. No.: 686,473

[22] Filed: Jul. 25, 1996

[30] Foreign Application Priority Data

Jul. 28, 1995 [JP] Japan ............... 7-212688

[51] Int. Cl.$^6$ ............... H01S 3/19; H01L 33/00
[52] U.S. Cl. ............... 372/48; 257/13; 257/103
[58] Field of Search ............... 372/48, 46, 45; 257/13, 76, 79, 94, 103

[56] References Cited

U.S. PATENT DOCUMENTS

| | | | |
|---|---|---|---|
| 5,363,395 | 11/1994 | Gaines et al. | 372/45 |
| 5,371,756 | 12/1994 | Fujii | 372/45 |
| 5,404,031 | 4/1995 | Sasaki et al. | 257/95 |

*Primary Examiner*—James W. Davie
*Attorney, Agent, or Firm*—Hill, Steadman & Simpson

[57] ABSTRACT

A p-type GaAs current block layer is stacked on a (100)-oriented n-type GaAs substrate, and a stripe-shaped groove is formed in the p-type GaAs current block layer to extend in the <01-1> direction. Side surfaces of the groove has the maximum inclination not larger than 60°. The thickness of the p-type GaAs current block layer is 1.5 μm or more. Stacked on the structured substrate having the current narrowed mechanism via an n-type ZnSe buffer layer are an n-type ZnMgSSe cladding layer, n-type ZnSSe waveguide layer, active layer, p-type ZnSSe waveguide layer, p-type ZnMgSSe cladding layer, and others, to establish an index-guided inner-striped semiconductor laser having SCH structure and CSPW structure.

17 Claims, 8 Drawing Sheets

5,732,099

SEMICONDUCTOR LIGHT EMITTING DEVICE

BACKGROUND OF THE INVENTION

1. Field of the Invention

This invention relates to a semiconductor light emitting device, especially suitable for those using II–VI compound semiconductors.

2. Related Art

Having larger and larger demands for blue to green semiconductor lasers as light sources in high density optical disk systems, there are animated studies for realization of such devices. Most prospective materials for fabricating semiconductor lasers capable of blue to green light are II–VI compound semiconductors. Some kinds of semiconductor lasers using II–VI compound semiconductors, which are different in laser structure, have been proposed and examined. Among them, a semiconductor laser having the structure called ZnCdSe/ZnSSe/ZnMgSSe SCH (separate confinement heterostructure), in which the ZnCdSe layer makes the active layer, the ZnSSe layer the waveguide layer, and the ZnMgSSe layer the cladding layer, has a high performance and attains continuous oscillation of one hour at room temperature ((1) Jpn. J. Appl. Phys. 33(1994) pp. L938–934, (2) IEEE Lasers and ElectroOptics Society's Annual Meeting, Boston, 1994, PDP 1.1).

Another proposal has been examined to reduce the threshold current density of a semiconductor laser and to control its lateral optical mode by adding a lateral index-guided structure to the SCH structure. As a result, pulse oscillation was attained with a semiconductor laser having a 2 μm-wide buried ridge and high-reflective end coating at a room temperature under the threshold current density of 700 A/cm$^2$ ((3) Appl. Phys. Lett., 63(1993) pp. 2315–2317). Also with a semiconductor laser having a 4.5 μm-wide buried ridge and high reflective end coating, continuous oscillation was attained at a room temperature under the threshold current density of 310 A/cm$^2$ ((4) Journal of Vacuum Science & Technology B12 (1994) pp. 2480–2483).

Also known is a semiconductor laser using II–VI compounds, with ZnSSe as its cladding layers, to form so-called CSPW (channeled-substrate planar waveguide) which is often used for decreasing the threshold current density in AlGaAs/GaAs semiconductor lasers (Japanese Patent Laid-Open No. 6-314856). However, it is considered difficult for this II–VI compound semiconductor laser to operate for continuous oscillation at room temperature, because of the use of ZnSSe as its cladding layers.

OBJECT AND SUMMARY OF THE INVENTION

It is therefore a primary object of the invention to provide a semiconductor light emitting device usable to realize a semiconductor laser having a laser structure of II–VI compound semiconductor layers on a structured substrate with a current narrowed structure such as CSPW structure and capable of continuous emission of blue to green light with a low threshold current density at a room temperature.

The present Inventor has made earnest studies to attain the above object, as summarized below.

FIG. 1 shows an example in which epitaxially grown on a GaAs substrate 101 is a GaAs current block layer 102 whose conduction type is opposite from the GaAs substrate 101, followed by forming on the structured substrate having the current narrowed structure a stripe-shaped groove 102a in the GaAs current block layer 102 and next epitaxially growing a plurality of II–VI compound semiconductor layers 103 on the entire surface by molecular beam epitaxy (MBE).

According to the knowledge of the Inventor, if inclination θ of the side surfaces of the groove 102a formed in the GaAs current block layer 102 is large, it causes an increase in bent angle at upper portions of the II–VI compound semiconductors 103 (shaded portions in FIG. 1) along the side surfaces of the groove 102a and hence deteriorates the crystallographic property of the bent portions of the II–VI compound semiconductor layers 103. Such deterioration in the crystallographic property degrades characteristics of the semiconductor laser, and must be avoided. A solution is to reduce the slanting angle θ of the side surfaces of the groove 102a. The inventor realizes, through his knowledge, that inclination θ of 60° or less is effective to suppress deterioration in crystalline property at the bent portions of the II–VI compound semiconductor layer 103 to a certain extent. If side surfaces of the groove 102a have more or less curvature, their acceptable maximum inclination $\theta_{max}$ would be 60° or less.

From the viewpoint of efficiently narrowing the current, a larger thickness is preferable for the GaAs current block layer 102. The inventor realizes that a thickness of 1.5 μm or more of the GaAs current block layer 102 promises efficient narrowing of current. However, an excessive thickness of the GaAs current block layer 102 increases the step at the groove 102a and hence causes deterioration in crystalline property at the bent portions of the II–VI compound semiconductors 103. Thus, the thickness of the GaAs current block layer 102 is preferably as small as possible within the range promising a sufficient current narrowing effect.

The present invention has been made based upon the knowledge reviewed above.

That is, according to a first aspect of the invention, there is provided a semiconductor light emitting device comprising:

a semiconductor substrate having a cavity along a major surface thereof; and a plurality of II–VI compound semiconductor layers on the major surface of the semiconductor surface to make a light emitting structure, the II–VI compound semiconductor layers being bent along the cavity, and side surfaces of the cavity forming slant surfaces whose maximum inclination is not larger than 60°.

The semiconductor substrate is typically an n-type GaAs substrate.

An embodiment of the first aspect of the invention uses a current block layer having a stripe-shaped groove on a substantially planar major surface of the semiconductor substrate.

Another embodiment of the first aspect of the invention uses a current block layer having a stripe-shaped groove at a portion corresponding to a convex formed on a major surface of the semiconductor substrate, and having a thickness larger than the height of the convex.

The conduction type of the current block layer is opposite from the semiconductor substrate. The current block layer may be made of, for example, GaAs.

The current block layer has a thickness not less than 1.5 μm to ensure efficient current narrowing.

A semiconductor light emitting device according to a second aspect of the invention comprises:

a compound semiconductor substrate of a first conduction type having a substantially planar major surface;

a current block layer of a second conduction type on the major surface of the compound semiconductor substrate and having a stripe-shaped groove;

a first cladding layer of the first conduction type on the compound semiconductor substrate in the groove and on the current block layer;

an active layer on the first cladding layer;

a second cladding layer of the second conduction type on the active layer;

a first electrode electrically connected to the second cladding layer; and a second electrode electrically connected to the compound semiconductor substrate, the first cladding layer, active layer and second cladding layer being made of II–VI compound semiconductors, and the first cladding layer, active layer and second cladding layer being bent along the groove, and side walls of the groove forming slant surfaces whose maximum inclination is not larger than 60°.

In an embodiment of the second aspect of the invention, the compound semiconductor substrate and the current block layer are made of GaAs, and the first cladding layer and the second cladding layer are made of ZnMgSSe.

A semiconductor light emitting device according to a third aspect of the invention comprises:

a compound semiconductor substrate of a first conduction type having a convex on one of its major surfaces;

a current block layer of a second conduction type on the major surface of the compound semiconductor substrate to have a thickness larger than the height of the convex to make a stripe-shaped groove on the convex;

a first cladding layer of the first conduction type on the compound semiconductor substrate in the groove and on the current block layer;

an active layer on the first cladding layer;

a second cladding layer of the second conduction type on the active layer;

a first electrode electrically connected to the second cladding layer; and a second electrode electrically connected to the compound semiconductor substrate, the first cladding layer, active layer and second cladding layer being made of II–VI compound semiconductors, and the first cladding layer, active layer and second cladding layer being bent along the groove and, side surfaces of the groove forming slant surfaces whose maximum inclination is not larger than 60°.

In an embodiment of the third aspect of the invention, the compound semiconductor substrate and the current block layer are made of GaAs, and the first cladding layer and the second cladding layer are made of ZnMgSSe.

A semiconductor light emitting device according to a fourth aspect of the invention comprises:

a semiconductor substrate having a convex on one of its major surfaces; and a plurality of II–VI compound semiconductors stacked on the major surface of the semiconductor substrate to make a light emitting structure, the II–VI compound semiconductor layers being bent along the convex, and having side surfaces forming slant surfaces whose maximum inclination is not larger than 60°.

A semiconductor light emitting device according to a fifth aspect of the invention comprises:

a compound semiconductor substrate of a first conduction type having a convex on one of its major surfaces;

a first cladding layer of the first conduction type on the compound semiconductor substrate;

an active layer on the first cladding layer;

a second cladding layer of a second conduction type on the active layer;

a first electrode electrically connected to the second cladding layer; and a second electrode electrically connected to the compound semiconductor substrate, the first cladding layer, active layer and second cladding layer being made of II–VI compound semiconductors, and the first cladding layer, active layer and second cladding layer being bent along the convex, and side surfaces of the convex forming slant surfaces whose maximum inclination is not larger than 60°.

a compound semiconductor substrate of a first conduction type having a convex on a major surface;

a first cladding layer of the first conduction type on the compound semiconductor substrate;

an active layer on the first cladding layer;

a second cladding layer of a second conduction type on the active layer;

a first electrode electrically connected to the second cladding layer; and a second electrode electrically connected to the compound semiconductor substrate, the first cladding layer, active layer and second cladding layer being made of II–VI compound semiconductors, and the first cladding layer, active layer and second cladding layer being bent along the convex and having slant side surfaces whose maximum inclination is not larger than 60°.

II–VI compound semiconductor layers forming a light emitting structure in the invention comprise one or more group II elements chosen from the group consisting of zinc (Zn), magnesium (Mg), cadmium (Cd), mercury (Hg) and beryllium (Be) and one or more group VI elements chosen from the group consisting of selenium (Se), sulphur (S) and tellurium (Te).

According to the invention, the cavity or convex of the semiconductor substrate has slant side surfaces whose maximum inclination is 60° or less. Therefore, the bent angle of the II–VI compound semiconductor layers stacked on the semiconductor substrate along the side surfaces of the cavity or convex is small, and alleviates deterioration in crystallographic property of the II–VI compound semiconductor layers.

DETAILED DESCRIPTION OF THE PREFERRED EMBODIMENTS

Figure 1:
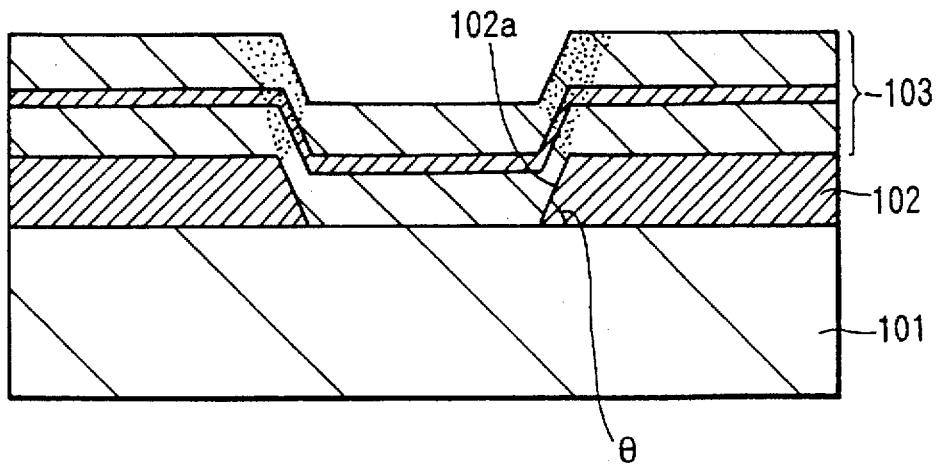
FIG. 1 is a cross-sectional view for explaining problems to be solved by the invention.

Embodiments of the invention are described below with reference to the drawings in which the same or equivalent elements are labelled with common reference numerals.

Figure 2:
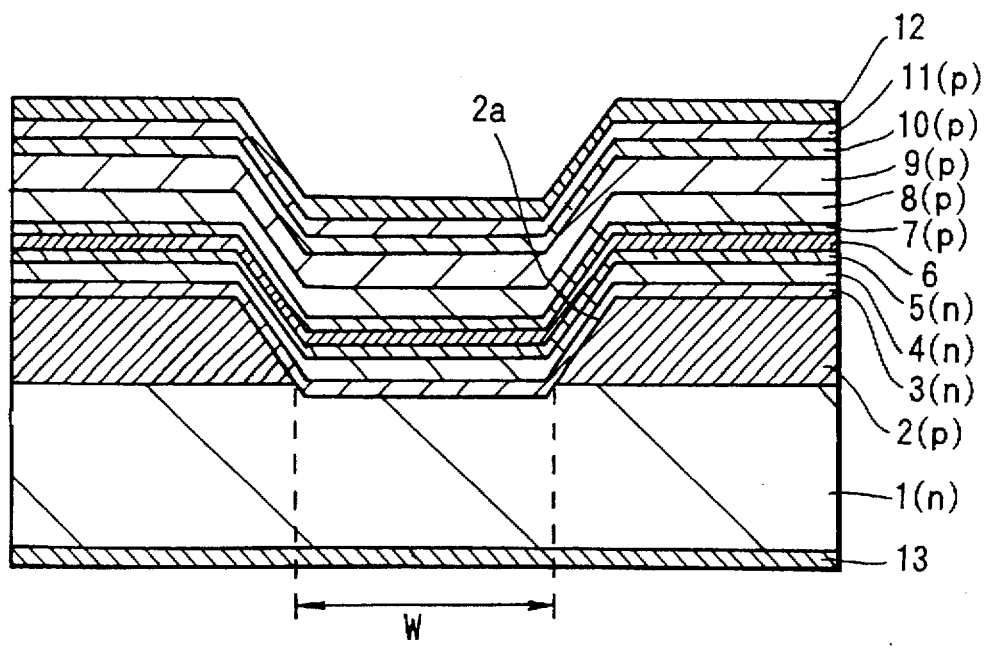
FIG. 2 is a cross-sectional view of a semiconductor laser according to a first embodiment of the invention, taken along a line normal to the cavity lengthwise direction.

FIG. 2 is a cross-sectional view of a semiconductor laser according to the first embodiment of the invention, taken along a line normal to the cavity lengthwise direction. The semiconductor laser according to the first embodiment is of an index-guided inner-striped type having a SCH structure and a CSPW structure.

As shown in FIG. 2, the semiconductor laser according to the first embodiment comprises a (100)-oriented n-type GaAs substrate 1 doped with a donor impurity, i.e. silicon (Si), and a p-type GaAs current block layer 2 doped with an acceptor impurity, i.e. Zn, stacked on the GaAs substrate 1 to form a current narrowing structure. The p-type GaAs current block layer 2 has a thickness not less than 1.5 μm, for example 2.5 μm, to ensure efficient current narrowing. The effective acceptor concentration $N_A - N_D$ (where $N_A$ is acceptor concentration and $N_D$ is donor concentration) of the p-type GaAs current block layer 2 is, for example, $1 \times 10^{18}$ cm$^{-3}$. The p-type GaAs current block layer 2 has formed a stripe-shaped groove 2a extending in the <01-1> direction. The groove 2a has slant side surfaces whose maximum inclination is 60° or less. The side surfaces make {111} planes, for example. The width W of the groove 2a is 6 μm, for example.

Sequentially stacked on the n-type GaAs substrate 1 in the groove 2a and on the p-type GaAs current block layer 2 are: an n-type ZnSe buffer layer 3 doped with a donor impurity such as chlorine (Cl); n-type ZnMgSSe cladding layer 4 doped with a donor impurity such as Cl; n-type ZnSSe waveguide layer 5 doped with a donor impurity such as Cl; active layer 6 of undoped ZnCdSe, for example; p-type ZnSSe waveguide layer 7 doped with an acceptor impurity such as nitrogen (N); p-type ZnMgSSe cladding layer 8 doped with an acceptor impurity such as N; p-type ZnSe contact layer 9 doped with an acceptor impurity such as N; p-type ZnSe/ZnTe multiquantum well (MQW) layer 10 having alternately stacked p-type ZnSe layers (quantum well layers) and p-type ZnTe layers (barrier layers) both doped with an acceptor impurity such N; and p-type ZnTe contact layer 11 doped with an acceptor impurity such as N.

These n-type ZnSe buffer layer 3, n-type ZnMgSSe cladding layer 4, n-type ZnSSe waveguide layer 5, active layer 6, p-type ZnSSe waveguide layer 7, p-type ZnMgSSe cladding layer 8, p-type ZnSe contact layer 9, p-type ZnSe/ZnTe multiquantum well (MQW) layer 10 and p-type ZnTe contact layer 11 are bent at and along the shape of the groove 2a. In the groove 2a, the active layer 6 located therein appears to be sandwiched by the n-type ZnMgSSe cladding layer 4 from opposite sides. Thus, an index-guided structure is formed. Since the maximum inclination of the side surfaces of the groove 2a is 60° or less, the n-type ZnSe buffer layer 3, n-type ZnMgSSe cladding layer 4, n-type ZnSSe waveguide layer 5, active layer 6, p-type ZnSSe waveguide layer 7, p-type ZnMgSSe cladding layer 8, p-type ZnSe contact layer 9, p-type ZnSe/ZnTe MQW layer 10 and p-type ZnTe contact layer 11 exhibit good crystallographic properties without deterioration even at their bent portions.

A p-side electrode 12 is formed on and in ohmic contact with the p-type ZnTe contact layer 11, and an n-side electrode 13 is formed on and in ohmic contact with the rear surface of the n-type GaAs substrate 1. The p-side electrode 12 may be, for example, a Pd/Pt/Au electrode made by stacking a 10 nm-thick Pd film, 100 nm-thick Pt film and 300 nm-thick Au film. The n-side electrode 13 may be, for example, an In electrode.

In this case, the undoped ZnCdSe active layer 6 sandwiched between the n-type ZnSSe waveguide layer 5 and the p-type ZnSSe waveguide layer 7 makes a ZnSSe/ZnCdSe single quantum well structure.

The n-type ZnMgSSe cladding layer 4, n-type ZnSSe waveguide layer 5, p-type ZnSSe waveguide layer 7 and p-type ZnMgSSe cladding layer 8 have compositions chosen to realize substantial lattice matching with the n-type GaAs substrate 1.

In a typical example, the n-type ZnSe buffer layer 3 is 20 nm thick, n-type ZnMgSSe cladding layer 4 is 1 μm thick, n-type ZnSSe waveguide layer 5 is 120 nm thick, ZnCdSe layer as the active layer 6 is 4 nm thick, p-type ZnSSe waveguide layer 7 is 120 nm thick, p-type ZnMgSSe cladding layer 8 is 0.8 μm thick, p-type ZnSe contact layer 9 is 1.6 μm thick, and p-type ZnTe contact layer 11 is 6 nm thick.

Effective donor concentrations $N_D-N_A$ of the n-type ZnSe buffer layer 3, n-type ZnMgSSe cladding layer 4 and n-type ZnSSe waveguide layer 5 are $5 \times 10^{17}$ cm$^{-3}$, for example. $N_A-N_D$ of the p-type ZnMgSSe cladding layer 8 is $5 \times 10^{16}$ cm$^{-3}$, and $N_D-N_A$ of the p-type ZnSSe waveguide layer 7, p-type ZnSe contact layer 9 and p-type ZnSe layer of the p-type ZnSe/ZnTe MQW layer 10 are $4 \times 10^{17}$ cm$^{-3}$, for example, and $N_D-N_A$ of the p-type ZnTe layers of the ZnSe/ZnTe MQW layer 10 and p-type ZnTe contact layer 11 are $1 \times 10^{18}$ cm$^{-3}$, for example.

The band gap energy of the n-type ZnMgSSe cladding layer 4 and the p-type ZnMgSSe cladding layer 8 is, for example, 2.9 eV at room temperature.

The reason why the p-type ZnSe/ZnTe MQW layer 10 is used lies in effectively removing a barrier due to a large discontinuity (about 0.8 eV) in the valence band along the bonded interface, which is caused when the p-type ZnSe contact layer 9 and the p-type ZnTe contact layer 11 are bonded directly, and may bar the injection of holes from the p-side electrode to the p-type ZnTe contact layer 11. To cope with the purpose, the p-type ZnTe layers gradually increase in thickness from one end adjacent to the p-type ZnSe contact layer 9 to the other end adjacent to the p-type ZnTe contact layer 11 such that the first quantum level of a respective quantum well layer comprising a p-type ZnTe layers of the p-type ZnSe/ZnTe MQW layer 10 coincides with the energy of the top of the valence band of p-type ZnSe and p-type ZnTe, and coincides with the first quantum level of any other quantum well layer in the same MQW layer 10.

Explained below a method for fabricating the semiconductor laser according to the first embodiment described above.

Figure 3:
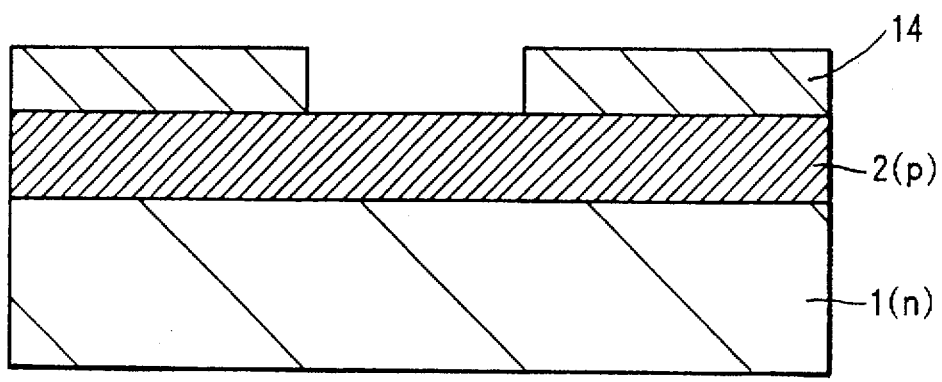
FIG. 3 is a cross-sectional view for explaining a method for fabricating the semiconductor laser according to the first embodiment of the invention.

First, as shown in FIG. 3, the p-type GaAs current block layer 2 is epitaxially grown on the (100)-oriented n-type GaAs substrate 1, for example, by atmospheric metallorganic chemical vapor deposition (MOCVD) at 720° C. For the epitaxial growth by MOCVD, trimethyl gallium (TMG) as material of Ga, arsine (AsH$_3$) as material of As and dimethyl zinc (DMZ) for Zn dopant as acceptor impurity may be used.

Lithography follows to make a resist pattern 14 including a groove extending in the <01-1> direction and having a predetermined width on the p-type GaAs current block layer 2.

Figure 4:
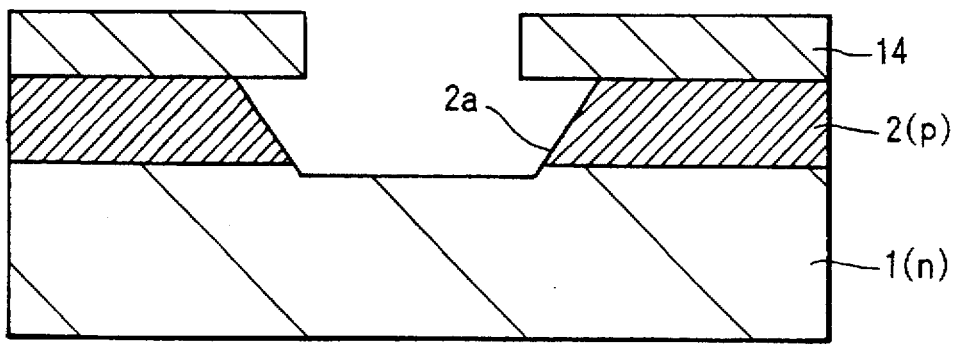
FIG. 4 is a cross-sectional view for explaining the method for fabricating the semiconductor laser according to the first embodiment of the invention.

Using the resist pattern 14 as a mask, the p-type GaAs current block layer 2 is selectively etched off. The etching may be wet etching using a liquid etchant such as a mixed liquid combining ammonia and hydrogen peroxide (of a composition with ammonia: hydrogen peroxide=1:30 in volume). The etching is continued until exposing the n-type GaAs substrate 1. As a result, as shown in FIG. 4, the groove 2a having a predetermined width and extending in the <01-1> direction is formed in the p-type GaAs current block layer 2. The maximum inclination of side surfaces of the groove 2a is 60° or less.

After the resist pattern 14 is removed, the n-type GaAs substrate 1 is brought into an ultrahigh-evacuated vacuum chamber of a molecular beam epitaxy (MBE) apparatus (not shown), and fixed onto a substrate holder. Then, the n-type GaAs substrate 1 is heated around 600° C., for example, in the ultrahigh-evacuated vacuum chamber to clean the surface (thermal cleaning).

Figure 5:
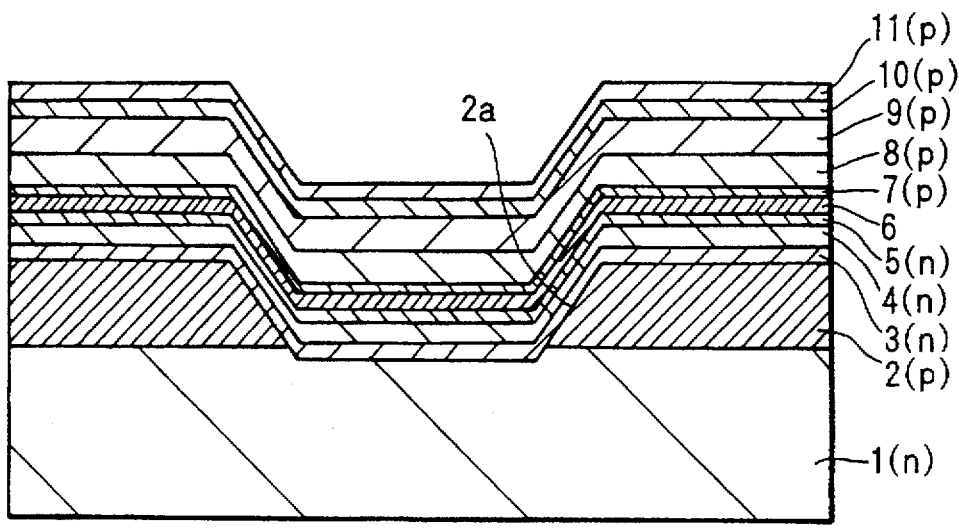
FIG. 5 is a cross-sectional view for explaining the method for fabricating the semiconductor laser according to the first embodiment of the invention.
Figure 6:
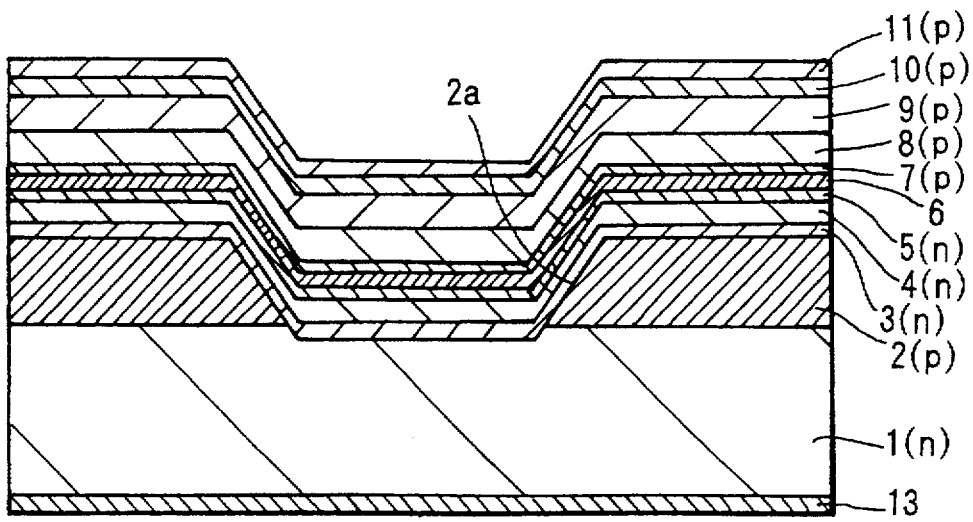
FIG. 6 is a cross-sectional view for explaining the method for fabricating the semiconductor laser according to the first embodiment of the invention.

Next as shown in FIG. 5, epitaxially grown on the surface-cleaned n-type GaAs substrate 1 are the n-type ZnSe buffer layer 3, n-type ZnMgSSe cladding layer 4, n-type ZnSSe waveguide layer 5, active layer 6 of, for example, undoped ZnCdSe, p-type ZnSSe waveguide layer 7, p-type ZnMgSSe cladding layer 8, p-type ZnSe contact layer 9, p-type ZnSe/ZnTe MQW layer 10 and p-type ZnTe contact layer 11 in this sequence.

The epitaxial growth by MBE uses Cd, Zn, Mg, Te and Se as their source materials, and bring them into a Knudsen cell (K cell) to generate molecular beams. It uses S as source material of S, and introduces it into a cracking cell having a molecular beam adjusting valve to generate a controlled amount of molecular beams. ZnCl$_2$ may be used as dopant for doping of Cl as the donor impurity of the n-type ZnSe buffer layer 3, n-type ZnMgSSe cladding layer 4 and n-type ZnSSe waveguide layer 5. Doping of N as the acceptor impurity of the p-type ZnSSe waveguide layer 7, p-type ZnMgSSe cladding layer 8, p-type ZnSe contact layer 9, p-type ZnSe/ZnTe MQW layer 10 and p-type ZnTe contact layer 11 is done by irradiating the substrate surface with active nitrogen generated from an electron-cyclotron resonance (ECR) plasma cell.

Figure 7:
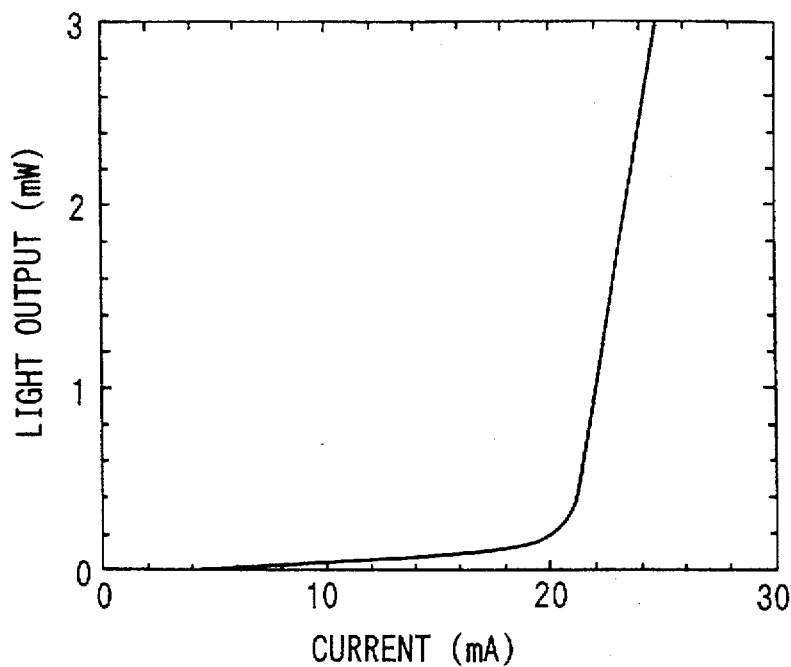
FIG. 7 is a graph showing a result of measurement of optical output versus electric current characteristics of the semiconductor laser according to the first embodiment of the invention at room temperature.

Next as shown in FIG. 7, the n-side electrode 13 such as In electrode is formed on the rear surface of the n-type GaAs substrate 1 by, for example, vacuum evaporation.

Next, as shown in FIG. 2, the p-side electrode 12, such as Pd/Pt/Au electrode, is formed by stacking a Pd film, Pt film and Au film on the entire surface of the p-type ZnTe contact layer 11 by vacuum evaporation, and it is brought into ohmic contact with the p-type ZnTe contact layer 11, after annealing, if necessary.

The n-type GaAs substrate 1 having the laser structure thereon is cleaved into bars each having opposite cavity end surfaces, and each bar is cleaved into chips to be packaged.

Figure 8:
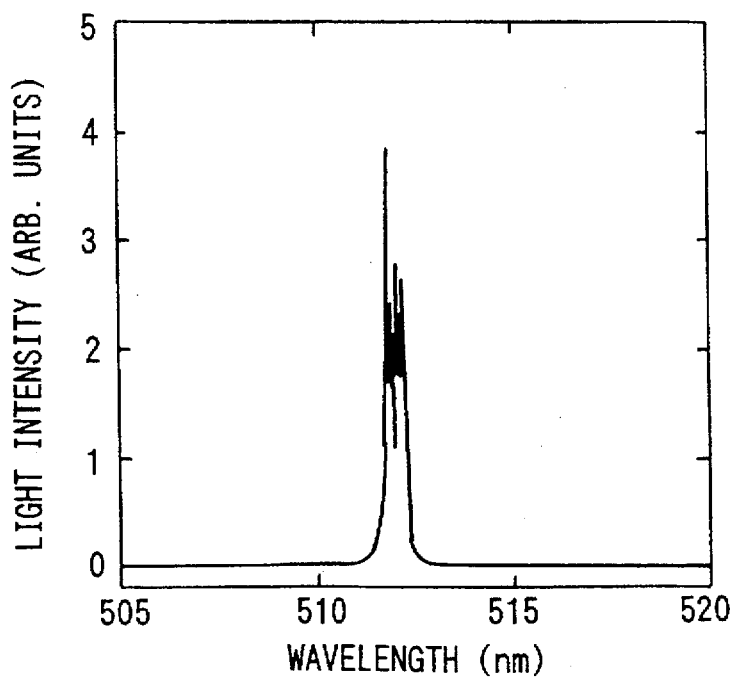
FIG. 8 is a graph showing a result of measurement of the spectrum of light emitted by the semiconductor laser according to the first embodiment of the invention at room temperature.

FIG. 7 shows a result of measurement of optical outputs versus electric current characteristics of the semiconductor laser according to the first embodiment activated for pulsating operation at room temperature. FIG. 8 shows a result of measurement of the spectrum of light emitted by the semiconductor laser. The cavity length of the semiconductor laser used for the measurement is 1 mm. The width of the driving pulse of the semiconductor laser is 3 μm, and its duty ratio is 0.1%. In FIG. 8, the light emitting peak is observed around the wavelength of 512 nm (green), which means that laser oscillation occurs with the wavelength of 512 nm. In FIG. 7, if lateral dispersion of current in the II–VI compound semiconductor layers forming the semiconductor laser and in the p-type GaAs current block layer 2 is neglected, the threshold current density is estimated to be 350 A/cm$^2$. The slope efficiency is 0.76 A/W, and the corresponding differential quantum efficiency is 63%. Although not shown, photographs of near field patterns were taken with a CCD video camera while introducing into the semiconductor laser an electric current of a lower current density than the threshold current and an electric current of a higher current density than the threshold current, and it was confirmed that good current confinement characteristics and good index-guided characteristics were obtained within the channel width W.

On the other hand, another semiconductor laser was prepared which has the same structure as that of the semiconductor laser according to the first embodiment except that front one of a pair of opposite cavity end surfaces extending normal to the cavity lengthwise direction, from which laser beams exit, is coated with a multilayered film comprising one cyclic stacking of an Al$_2$O$_3$ film and a Si film, and rear one of the cavity end surfaces extending normal to the cavity lengthwise direction, from which laser beams do not exit, is coated with a multilayered film comprising two-cyclic stacking of $Al_2O_3$ films and Si films, such that the front end surface exhibits the reflectivity of 70% while the read end surface exhibits the reflectivity of 95%. As a result of similar measurement of optical output versus electric current characteristics and the spectrum of emitted light of the sample, the threshold current density is further reduced to 240 A/cm$_2$. The value of the threshold current density is the lowest value ever reported in regard of semiconductor lasers.

As reviewed above, the first embodiment, which uses the p-type GaAs current block layer 2 formed on the n-type GaAs substrate and having the stripe-shaped groove 2a, and stacks II–VI compound semiconductor layers on the n-type GaAs substrate 1 in the groove 2a and on the p-type GaAs current block layer 2 to form a laser structure, can realize a semiconductor laser of an index-guided inner-striped type having SCH structure and CSPW structure with a low threshold current density capable of emitting green light of the wavelength of 512 nm at room temperature.

Figure 9:
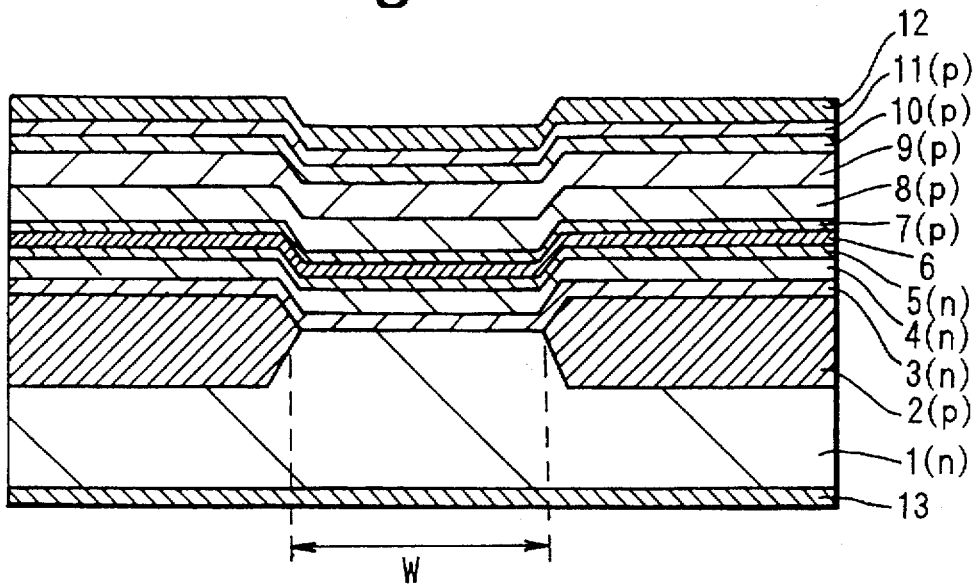
FIG. 9 is a cross-sectional view of a semiconductor laser according to a second embodiment of the invention, taken along a line normal to the cavity lengthwise direction.

FIG. 9 shows a semiconductor laser according to a second embodiment of the invention. Also this semiconductor laser is of the index-guided inner-striped type having SCH structure and CSPW structure.

As shown in FIG. 9, the semiconductor laser according to the second embodiment comprises a (100)-oriented n-type GaAs substrate 1 doped with a donor impurity, i.e. silicon (Si), and having formed a stripe-shaped convex 1a extending in the <01-1> direction on one of its major surfaces. A p-type GaAs current block layer 2 doped with Zn, for example, as an acceptor impurity is stacked on the n-type GaAs substrate 1 to fill opposite sides of the convex 1a and to be higher than the top surface of the convex 1a. In the same manner as the first embodiment, the p-type GaAs current block layer 2 preferably has a thickness not less than 1.5 µm, for example, 2.5 µm to ensure efficient current narrowing. The maximum inclination of side surfaces of the groove 2a is formed in the p-type GaAs current block layer 2 on the convex 1a is 60° or less. The side surfaces make {111} planes, for example. The width W of the groove 2a is 6 µm, for example.

In the same manner as the first embodiment, sequentially stacked the stripe-shaped convex 1a and on the p-type GaAs current block layer 2 are: an n-type ZnSe buffer layer 3 doped with a donor impurity such as Cl; n-type ZnMgSSe cladding layer 4 doped with a donor impurity such as Cl; n-type ZnSSe waveguide layer 5 doped with a donor impurity such as Cl; active layer 6 of undoped ZnCdSe, for example; p-type ZnSSe waveguide layer 7 doped with an acceptor impurity such as N; p-type ZnMgSSe cladding layer 8 doped with an acceptor impurity such as N; p-type ZnSe contact layer 9 doped with an acceptor impurity such as N; p-type ZnSe/ZnTe MQW layer 10 doped with an acceptor impurity such N; and p-type ZnTe contact layer 11 doped with an acceptor impurity such as N.

These n-type ZnSe buffer layer 3, n-type ZnMgSSe cladding layer 4, n-type ZnSSe waveguide layer 5, active layer 6, p-type ZnSSe waveguide layer 7, p-type ZnMgSSe cladding layer 8, p-type ZnSe contact layer 9, p-type ZnSe/ZnTe MQW layer 10 and p-type ZnTe contact layer 11 are bent at and along the shape of the groove 2a. In the groove 2a, the active layer 6 located therein appears to be sandwiched by the n-type ZnMgSSe cladding layer 4 from opposite sides. Thus, an index-guided structure is formed. Since the maximum inclination of the side surfaces of the groove 2a is 60° or less and also because the height of the step at the groove 2a is less by the height of the convex 1a itself than that of the first embodiment, crystallographic properties of the n-type ZnSe buffer layer 3, n-type ZnMgSSe cladding layer 4, n-type ZnSSe waveguide layer 5, active layer 6, p-type ZnSSe waveguide layer 7, p-type ZnMgSSe cladding layer 8, p-type ZnSe contact layer 9, p-type ZnSe/ZnTe MQW layer 10 and p-type ZnTe contact layer 11 at their bent portions are good with no deterioration.

The other aspects of the second embodiment are the same as the semiconductor laser according to the first embodiment.

Explained below a method for fabricating the semiconductor laser according to the second embodiment described above.

Figure 10:
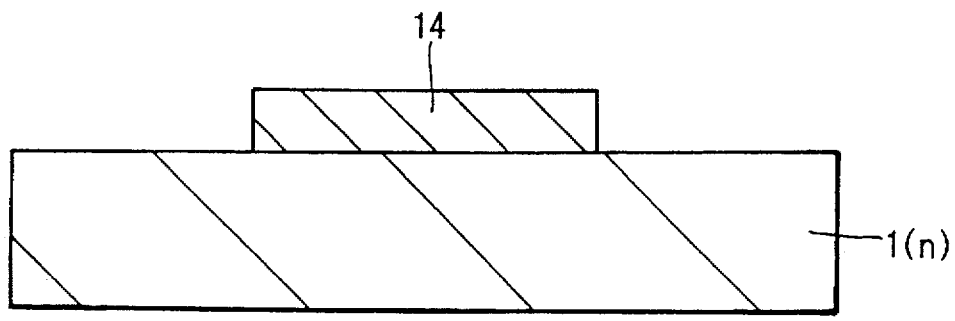
FIG. 10 is a cross-sectional view for explaining a method for fabricating the semiconductor laser according to the second embodiment of the invention.

First, as shown in FIG. 10, a resist pattern in form of a stripe extending in the <01-1> direction and having a predetermined width is formed on a (100)-oriented n-type GaAs substrate having a planar front surface.

Figure 11:
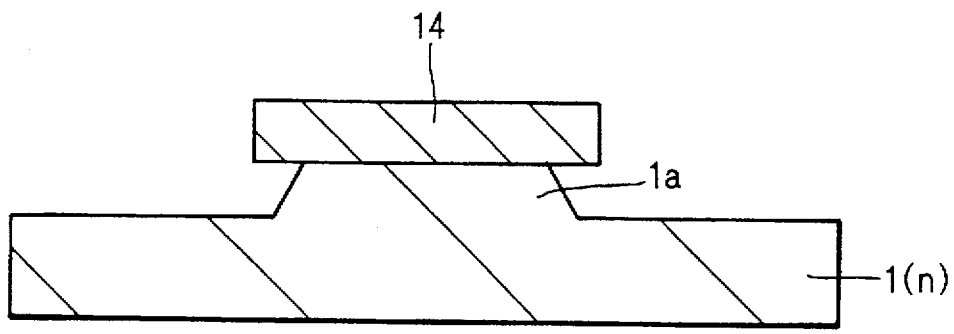
FIG. 11 is a cross-sectional view for explaining a method for fabricating the semiconductor laser according to the second embodiment of the invention.

Using the resist pattern 14 as a mask, the n-type GaAs substrate 1 is selectively etched off. The etching may be wet etching using a liquid etchant such as a mixed liquid combining ammonia and hydrogen peroxide (of a composition with ammonia: hydrogen peroxide=1:30 in volume). As a result of the etching, the stripe-shaped convex 1a having a predetermined width and extending in the <01-1> direction is formed on the n-type GaAs substrate 1 as shown in FIG. 11.

Figure 12:
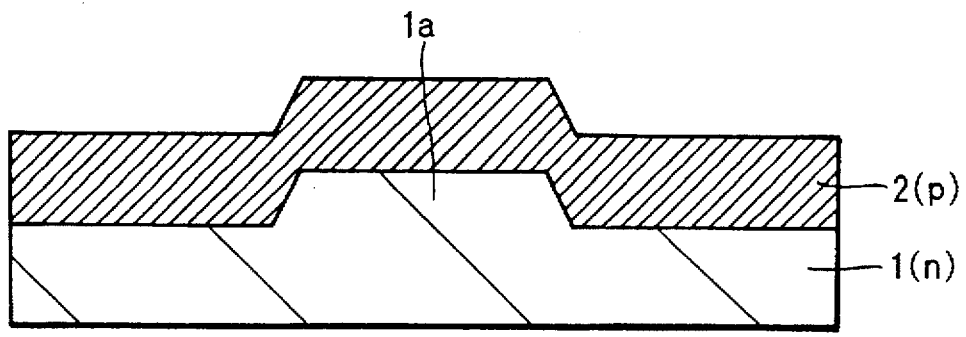
FIG. 12 is a cross-sectional view for explaining a method for fabricating the semiconductor laser according to the second embodiment of the invention.

Next as shown in FIG. 12, after the resist pattern 14 is removed, the p-type GaAs current block layer 2 is epitaxially grown on the entire surface of the n-type GaAs substrate 1, for example, by atmospheric metallorganic chemical vapor deposition (MOCVD), as used in the first embodiment, at 700° C., for example.

Figure 13:
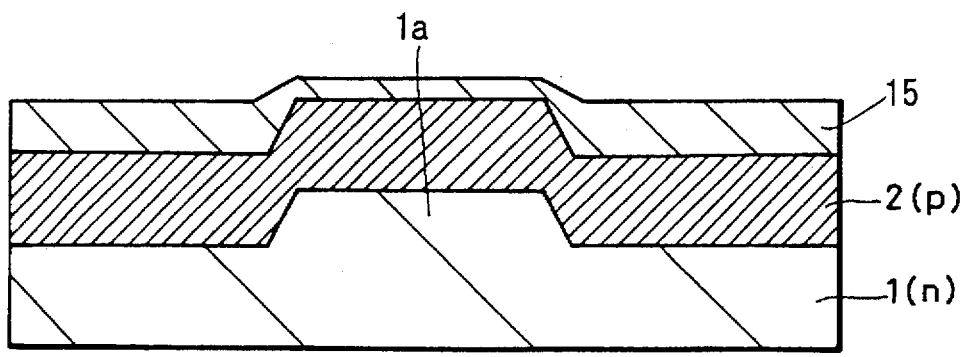
FIG. 13 is a cross-sectional view for explaining a method for fabricating the semiconductor laser according to the second embodiment of the invention.

As shown in FIG. 13, a resist layer 15 is applied onto the entire surface of the p-type GaAs current block layer 2. The thickness of a part of the resist layer 15 on the convex 2b appearing on the p-type GaAs current block layer 2 due to the convex 1a on the n-type GaAs substrate 1 becomes smaller than the thickness of the remainder part of the resist layer 15.

Figure 14:
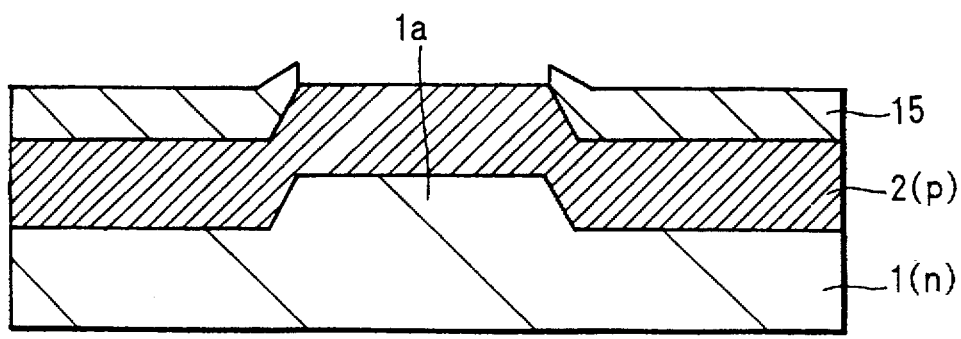
FIG. 14 is a cross-sectional view for explaining a method for fabricating the semiconductor laser according to the second embodiment of the invention.

After exposure of the entire surface of the resist layer 15, development is done to selectively remove the thin portion of the resist pattern 15 near the convex 2b of the p-type GaAs current block layer 2. As a result, the convex 2b of the p-type GaAs current block layer 2 is exposed in a self-aligned manner as shown in FIG. 14.

Figure 15:
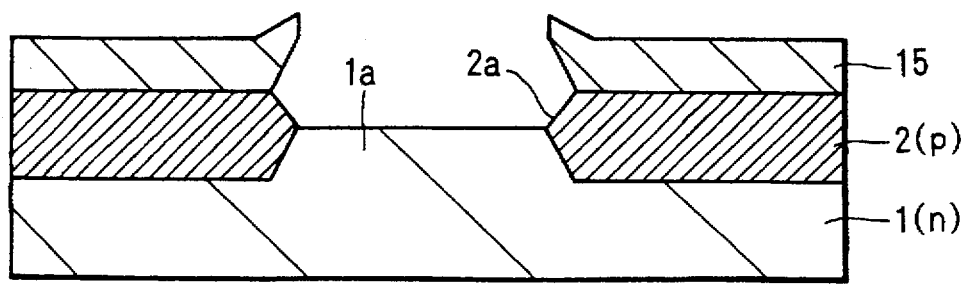
FIG. 15 is a cross-sectional view for explaining a method for fabricating the semiconductor laser according to the second embodiment of the invention.

Using the resist layer 15 as a mask, the p-type GaAs current block layer 2 is selectively etched off. The etching may be wet etching using a liquid etchant such as a mixed liquid combining ammonia and hydrogen peroxide (of a composition with ammonia: hydrogen peroxide=1:30 in volume). The etching is continued until exposing the n-type GaAs substrate 1. As a result, as shown in FIG. 15, the groove 2a having a predetermined width and extending in the <01-1> direction is formed in the p-type GaAs current block layer 2.

Figure 16:
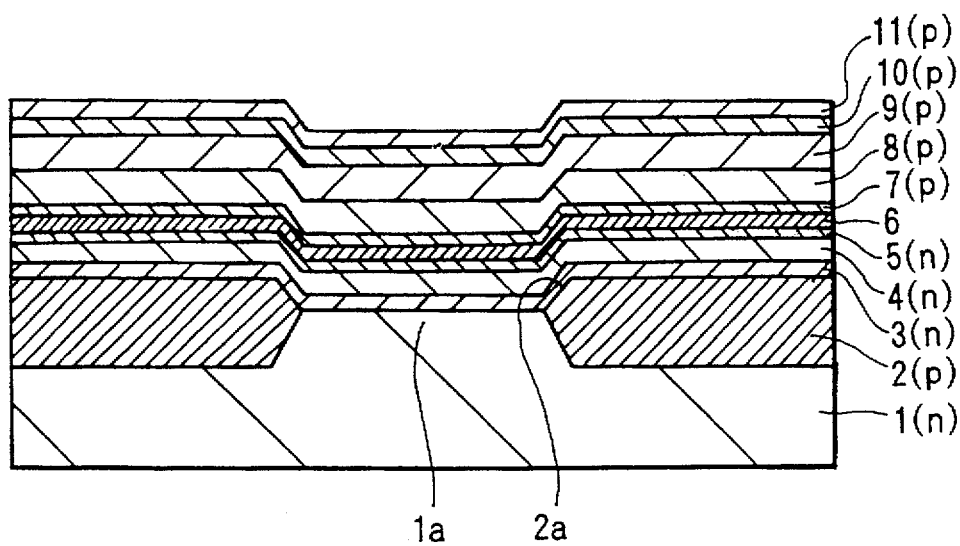
FIG. 16 is a cross-sectional view for explaining a method for fabricating the semiconductor laser according to the second embodiment of the invention.

After that, as shown in FIG. 16, epitaxially grown on the n-type GaAs substrate 1 in the groove 2a and on the p-type GaAs current block layer 2 are the n-type ZnSe buffer layer 3, n-type ZnMgSSe cladding layer 4, n-type ZnSSe waveguide layer 5, active layer 6 of, for example, undoped ZnCdSe, p-type ZnSSe waveguide layer 7, p-type ZnMgSSe cladding layer 8, p-type ZnSe contact layer 9, p-type ZnSe/ZnTe MQW layer 10 and p-type ZnTe contact layer 11 in this sequence in the same manner as for the semiconductor laser according to the first embodiment.

Figure 17:
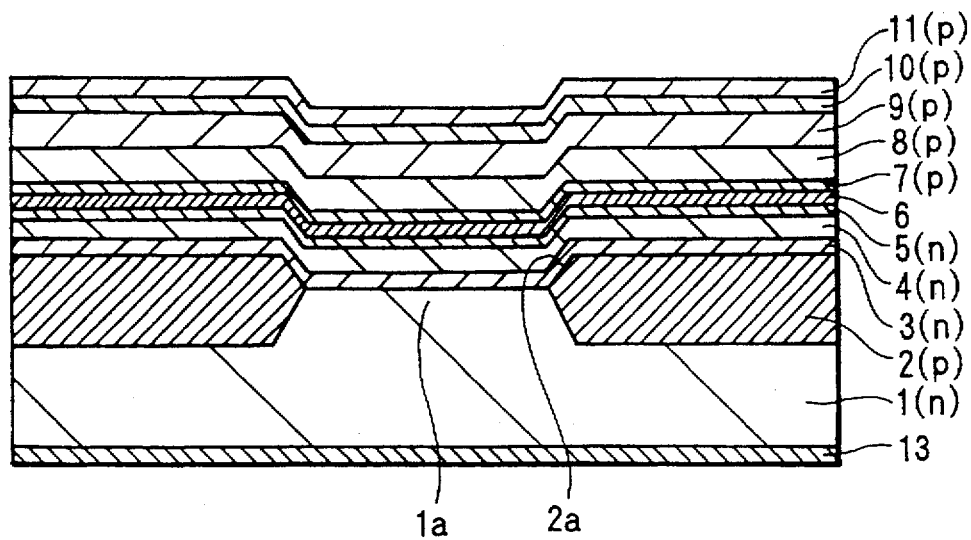
FIG. 17 is a cross-sectional view for explaining a method for fabricating the semiconductor laser according to the second embodiment of the invention.

As shown in FIG. 17, the n-side electrode 13 such as In electrode is formed on the rear surface of the n-type GaAs substrate 1 by, for example, vacuum evaporation.

As shown in FIG. 9, the p-side electrode 12, such as Pd/Pt/Au electrode, is formed and brought into ohmic contact with the p-type ZnTe contact layer 11, after annealing, if necessary.

The n-type GaAs substrate 1 having the laser structure thereon is cleaved into bars each having opposite cavity end surfaces, and each bar is cleaved into chips to be packaged.

The second embodiment described above promises the same advantages as those of the first embodiment, and also gives the additional advantage that, because the height of the step at the groove 2a of the p-type GaAs current block layer 2 is less than that of the first embodiment, deterioration in crystallographic property of the II–VI compound semiconductor layers above the side surfaces of the groove 2a can be prevented effectively, and more excellent laser characteristics can be obtained.

Figure 18:
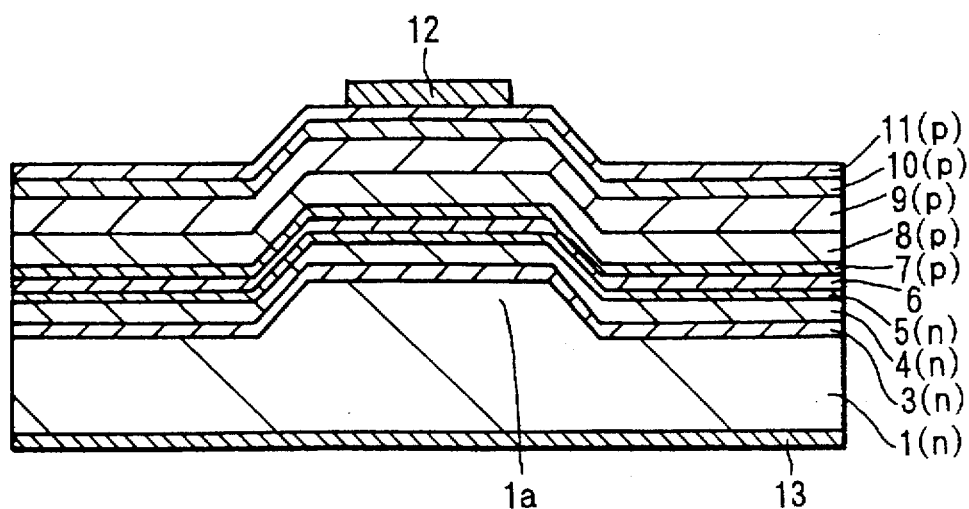
FIG. 18 is a cross-sectional view of a semiconductor laser according to a third embodiment of the invention.

FIG. 18 shows a semiconductor laser according to the third embodiment of the invention.

As shown in FIG. 18, the semiconductor laser according to the third embodiment comprises a (100)-oriented n-type GaAs substrate 1 doped with a donor impurity, i.e. silicon (Si), and having formed a stripe-shaped convex 1a extending in the <01-1> direction on one of its major surfaces. Side surfaces of the convex 1a are inclined, and their maximum inclination is 60° or less. The side surfaces of the convex 1a are made of {111} planes, for example.

In the same manner as the first embodiment, sequentially stacked the entirety of the major surface of the n-type GaAs substrate 1 having the convex 1a are: an n-type ZnSe buffer layer 3 doped with a donor impurity such as Cl; n-type ZnMgSSe cladding layer 4 doped with a donor impurity such as Cl; n-type ZnSSe waveguide layer 5 doped with a donor impurity such as Cl; active layer 6 of undoped ZnCdSe, for example; p-type ZnSSe waveguide layer 7 doped with an acceptor impurity such as N; p-type ZnMgSSe cladding layer 8 doped with an acceptor impurity such as N; p-type ZnSe contact layer 9 doped with an acceptor impurity such as N; p-type ZnSe/ZnTe MQW layer 10 doped with an acceptor impurity such N; and p-type ZnTe contact layer 11 doped with an acceptor impurity such as N.

These n-type ZnSe buffer layer 3, n-type ZnMgSSe cladding layer 3, n-type ZnSSe waveguide layer 5, active layer 6, p-type ZnSSe waveguide layer 7, p-type ZnMgSSe cladding layer 8, p-type ZnSe contact layer 9, p-type ZnSe/ZnTe MQW layer 10 and p-type ZnTe contact layer 11 are bent at and along the shape of the groove 2a. In the groove 2a, the active layer 6 located therein appears to be sandwiched by the n-type ZnMgSSe cladding layer 4 from opposite sides. Thus, an index-guided structure is formed. Since the maximum inclination of the side surfaces of the groove 2a is 60° or less, the n-type ZnSe buffer layer 3, n-type ZnMgSSe cladding layer 4, n-type ZnSSe waveguide layer 5, active layer 6, p-type ZnSSe waveguide layer 7, p-type ZnMgSSe cladding layer 8, p-type ZnSe contact layer 9, p-type ZnSe/ZnTe MQW layer 10 and p-type ZnTe contact layer 11 exhibit good crystallographic properties without deterioration even at their bent portions.

In this case, unlike the first and second embodiments, the p-side electrode 12 does not extend on the entire surface of the p-type ZnTe contact layer 11. Instead, it has a stripe-shaped configuration extending in the <01-1> direction only on a selective portion of the p-side ZnTe contact layer 11 above the convex 1a of the n-type GaAs substrate 1.

The other aspects of the third embodiment are the same as the semiconductor laser according to the first embodiment.

The same method as used for the semiconductor laser according to the first embodiment may be used also for fabricating the semiconductor laser according to the third embodiment.

The third embodiment described above promises the advantages that, because the maximum inclination of the side surfaces of the convex 1a on the n-type GaAs substrate 1 is 60° or less, deterioration of the II–VI compound semiconductor layers can be alleviated even along the convex 1a, which in turn promises excellent laser characteristics with a low threshold current density.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, although the first to third embodiments have been described as applying the invention to SCH-structured semiconductor lasers, the invention may be applied also to semiconductor lasers having a DH structure (double heterostructure).

The invention may be applied also to light emitting diodes using II–VI compound semiconductors other than semiconductor lasers taken as the first to third embodiments.

As described above, according to the invention, since a cavity or a convex formed in or on a semiconductor substrate such that side surfaces of the cavity or convex provide inclined surfaces with the maximum inclination not larger than 60°, II–VI compound semiconductor layers stacked to make a light emitting structure above the side surfaces of the cavity or convex exhibit good crystalline properties without deterioration. Therefore, the invention can realize a semiconductor laser which has a laser structure comprising II–VI compound semiconductor layers on the structured substrate having a current narrowed structure such as CSPW structure and can emit blue to green light with a low threshold current density.

What is claimed is:

1. A semiconductor light emitting device comprising:
   a semiconductor substrate having a cavity along a major surface thereof; and
   a plurality of II–VI compound semiconductor layers on the major surface of said semiconductor substrate to make a light emitting structure,
   said II–VI compound semiconductor layers being bent along said cavity, and side walls of said cavity forming slant surfaces whose maximum inclination is not larger than 60°.

2. The semiconductor light emitting device according to claim 1, wherein said semiconductor substrate is an n-type GaAs substrate.

3. The semiconductor light emitting device according to claim 1, wherein said semiconductor substrate has a substantially planar major surface which includes a current block layer having a stripe-shaped groove.

4. The semiconductor light emitting device according to claim 1, wherein said semiconductor substrate has a major surface including a convex and wherein a current block layer is stacked on said major surface to stand higher than said convex and to make a stripe-shaped groove on and along said convex.

5. The semiconductor light emitting device according to claim 3, wherein said current block layer has a conduction type opposite from said semiconductor substrate.

6. The semiconductor light emitting device according to claim 4, wherein said current block layer has a conduction type opposite from said semiconductor substrate.

7. The semiconductor light emitting device according to claim 3, wherein said current block layer is made of GaAs.

8. The semiconductor light emitting device according to claim 4, wherein said current block layer is made of GaAs.

9. The semiconductor light emitting device according to claim 3, wherein said current block layer has a thickness not less than 1.5 µm.

10. The semiconductor light emitting device according to claim 4, wherein said current block layer has a thickness not less than 1.5 µm.

11. A semiconductor light emitting device comprising:

a compound semiconductor substrate of a first conduction type having a substantially planar major surface;

a current block layer of a second conduction type on said major surface of said compound semiconductor substrate and having a stripe-shaped groove;

a first cladding layer of said first conduction type on said compound semiconductor substrate in said groove and on said current block layer;

an active layer on said first cladding layer;

a second cladding layer of said second conduction type on said active layer;

a first electrode electrically connected to said second cladding layer; and a second electrode electrically connected to said compound semiconductor substrate, said first cladding layer, said active layer and said second cladding layer being made of II–VI compound semiconductors, and said first cladding layer, said active layer and said second cladding layer being bent along said groove, and side walls of said groove forming slant surfaces whose maximum inclination is not larger than 60°.

12. The semiconductor light emitting device according to claim 11, wherein said compound semiconductor substrate and said current block layer are made of GaAs, and said first cladding layer and said second cladding layer are made of ZnMgSSe.

13. A semiconductor light emitting device comprising:

a compound semiconductor substrate of a first conduction type having a convex on a major surface thereof;

a current block layer of a second conduction type on said major surface of the compound semiconductor substrate to have a thickness larger than the height of said convex to make a stripe-shaped groove on said convex;

a first cladding layer of said first conduction type on said the compound semiconductor substrate in said groove and on said current block layer;

an active layer on said first cladding layer;

a second cladding layer of said second conduction type on said active layer;

a first electrode electrically connected to said second cladding layer; and a second electrode electrically connected to said compound semiconductor substrate, said first cladding layer, said active layer and said second cladding layer being made of II–VI compound semiconductors, and said first cladding layer, said active layer and said second cladding layer being bent along said groove and, side surfaces of said groove forming slant surfaces whose maximum inclination is not larger than 60°.

14. The semiconductor light emitting device according to claim 13, wherein said compound semiconductor substrate and said current block layer are made of GaAs, and said first cladding layer and said second cladding layer are made of ZnMgSSe.

15. A semiconductor light emitting device comprising:

a semiconductor substrate having a convex on a major surface thereof; and a plurality of II–VI compound semiconductors on said major surface of said semiconductor substrate to make a light emitting structure, said II–VI compound semiconductor layers being bent along said convex, and having side surfaces forming slant surfaces whose maximum inclination is not larger than 60°.

16. A semiconductor light emitting device comprising:

a compound semiconductor substrate of a first conduction type having a convex on a major surface thereof;

a first cladding layer of said first conduction type on said compound semiconductor substrate;

an active layer on said first cladding layer;

a second cladding layer of a second conduction type on said active layer;

a first electrode electrically connected to said second cladding layer; and a second electrode electrically connected to said compound semiconductor substrate, said first cladding layer, said active layer and said second cladding layer being made of II–VI compound semiconductors, and said first cladding layer, said active layer and said second cladding layer being bent along said convex, and side surfaces of said convex forming slant surfaces whose maximum inclination is not larger than 60°.

17. A semiconductor light emitting device comprising:

an n-type GaAs substrate having a substantially planar major surface;

a p-type current block layer on said major surface of said substrate and having a stripe-shaped groove;

an n-type ZnMgSSe cladding layer on said substrate in said groove and on said current block layer;

an active layer on said n-type ZnMgSSe cladding layer;

a p-type ZnMgSSe cladding layer on said active layer;

a first electrode electrically connected to said p-type ZnMgSSe cladding layer; and a second electrode electrically connected to said substrate, said n-type ZnMgSSe cladding layer, said active layer and said p-type cladding layer being bent along said groove, and said groove having a height not less than 1.5 µm and slant side surfaces whose maximum inclination is not larger than 60°.

* * * * *